(12) United States Patent
Park et al.

(10) Patent No.: US 7,165,197 B2
(45) Date of Patent: Jan. 16, 2007

(54) APPARATUS AND METHOD OF ANALYZING A MAGNETIC RANDOM ACCESS MEMORY

(75) Inventors: Wan-jun Park, Seoul (KR); In-jun Hwang, Yongin-si (KR); Tae-wan Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 208 days.

(21) Appl. No.: 10/995,216

(22) Filed: Nov. 24, 2004

(65) Prior Publication Data
US 2005/0111253 A1    May 26, 2005

(30) Foreign Application Priority Data
Nov. 24, 2003    (KR)    .................... 10-2003-0083614

(51) Int. Cl.
*G11C 29/00*    (2006.01)
*G11C 11/00*    (2006.01)

(52) U.S. Cl. .................. 714/718; 714/42; 714/721; 714/745; 365/158; 365/209

(58) Field of Classification Search .............. None
See application file for complete search history.

(56) References Cited

U.S. PATENT DOCUMENTS

| 6,275,411 B1 | 8/2001 | Daughton et al. | |
|---|---|---|---|
| 6,538,940 B1 | 3/2003 | Nahas et al. | |
| 6,606,262 B1* | 8/2003 | Perner | 365/158 |
| 6,762,952 B1* | 7/2004 | Munden et al. | 365/158 |
| 6,791,873 B1* | 9/2004 | Perner | 365/158 |
| 6,894,938 B1* | 5/2005 | Smith et al. | 365/201 |
| 6,898,113 B1* | 5/2005 | Tsuji | 365/158 |
| 6,909,631 B1* | 6/2005 | Durlam et al. | 365/158 |
| 6,999,339 B1* | 2/2006 | Tuttle et al. | 365/158 |
| 2001/0019461 A1 | 9/2001 | Allensbach et al. | |

(Continued)

FOREIGN PATENT DOCUMENTS

WO    WO 03/036734    5/2003

OTHER PUBLICATIONS

Olaft Erve, "Device Properties of the Spin-Valve Transistor and Magnetic Tunnel Transistor", 2002, University of Twente, available on-line at http://www.utwente.nl/catalogue/book/index.isp?isbn=9036517354.*

*Primary Examiner*—Albert Decady
*Assistant Examiner*—John P Trimmings
(74) *Attorney, Agent, or Firm*—Lee & Morse, P.C.

(57) ABSTRACT

In an apparatus for analyzing a magnetic random access memory (MRAM), and a method of analyzing an MRAM, the apparatus includes an MRAM mounting unit on which an MRAM is mounted, a magnetic field applying unit positioned around the MRAM mounting unit for applying an external magnetic field to the MRAM mounted on the MRAM mounting unit, a cell addressing unit for selecting one of a plurality of unit cells of the MRAM mounted on the MRAM mounting unit, a source measurement unit for applying an internal magnetic field to the selected unit cell of the MRAM or for measuring a resistance of the selected unit cell of the MRAM, and a computer unit for storing and for analyzing data regarding the measured resistance of the each of the plurality of unit cells of the MRAM.

21 Claims, 10 Drawing Sheets

U.S. PATENT DOCUMENTS

| | | | |
|---|---|---|---|
| 2004/0027854 A1* | 2/2004 | Iwata et al. | 365/158 |
| 2004/0062092 A1* | 4/2004 | Hidaka | 365/200 |
| 2004/0213043 A1* | 10/2004 | Tuttle et al. | 365/173 |
| 2004/0257719 A1 | 12/2004 | Ohba et al. | |
| 2005/0102581 A1* | 5/2005 | Abraham et al. | 714/42 |
| 2006/0077704 A1* | 4/2006 | Tuttle et al. | 365/158 |

* cited by examiner

APPARATUS AND METHOD OF ANALYZING A MAGNETIC RANDOM ACCESS MEMORY

BACKGROUND OF THE INVENTION

1. Field of the Invention

The present invention relates to an apparatus and method of analyzing a magnetic random access memory (MRAM). More particularly, the present invention relates to an apparatus and method of analyzing an MRAM, which is capable of quickly analyzing all characteristics of the MRAM.

2. Description of the Related Art

Magnetic Random Access Memory (MRAM), a type of nonvolatile memory, is a solid-state magnetic memory that uses a magnetoresistance effect based on a nano magnetic material's characteristic effect of spin dependent tunneling. The MRAM uses a giant magnetoresistance (GMR) effect or a tunnel magnetoresistance (TMR) effect that occurs because spin of an electron (i.e., degree of freedom of an electron) greatly influences electron transfer. A conventional MRAM includes a cell array, in which word lines extend along rows of memory cells and bit lines extend along columns of memory cells. More specifically, memory cells are located at intersections of word lines and bit lines. Each memory cell includes two magnetic layers, i.e., a fixed layer and a free layer. The fixed layer is magnetically fixed and the free layer has a variable magnetization direction. The memory cell stores a data bit according to a relative magnetization orientation of the fixed layer and the free layer.

There is a limitation on selection of a material for a memory because low power consumption is required to commercialize the memory. A conventional MRAM uses permalloy (NiFe) in a switching field, that is, the free layer of the magnetoresistance element, in order to reduce power consumption. Increase of magnetoresistance is essential to increase an operating speed of an MRAM and for efficient design of chip architecture. To achieve this increase of magnetoresistance, a magnetic thin layer used in the free layer must have a ferromagnetic characteristic and a high polarization characteristic.

An MRAM having the above structure, for example, a tunnel magnetoresistance (TMR) structure, distinguishes data "0" and "1" by measuring a variation of tunnel resistances according to magnetic states of the two ferromagnetic layers, which are separated by a tunnel barrier. There are various non-uniform states during switching of the magnetic states of the ferromagnetic layers (free layers), i.e. writing data on the memory. Non-uniform states cause erroneous operation of the memory.

Figure 1A:
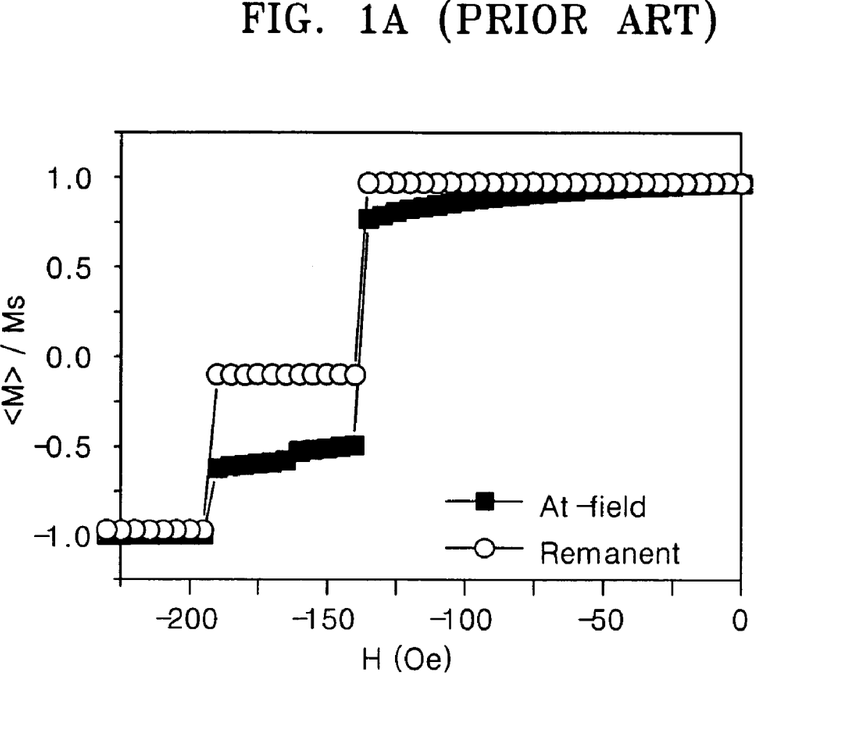
FIGS. 1A and 1B are graphs and illustrations showing non-uniform switching states of MRAM.
Figure 1B:
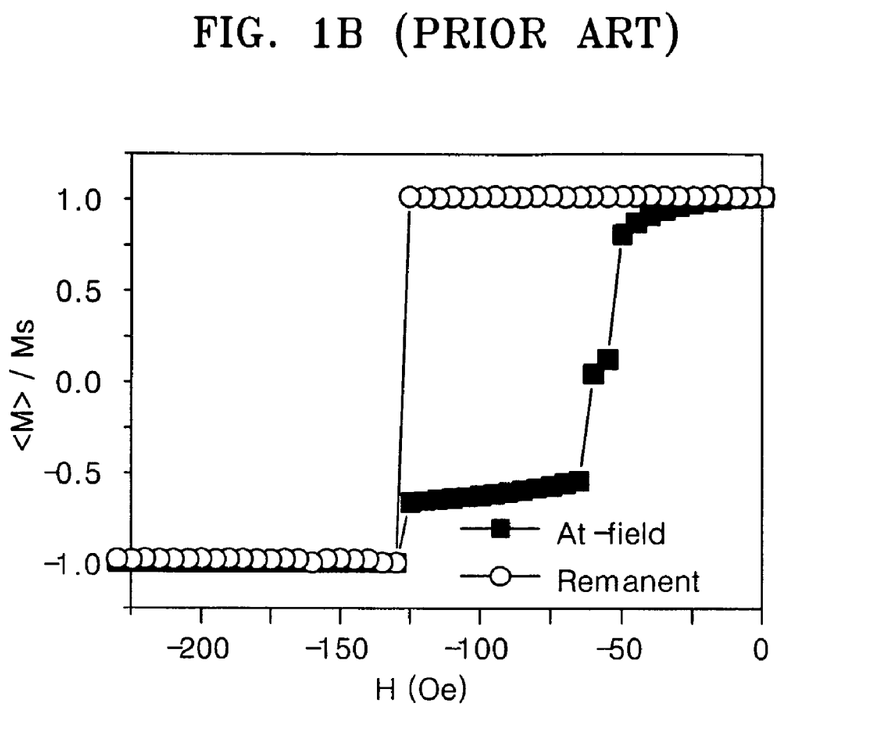

Generally, there are two factors that cause non-uniform switching states of the memory. FIGS. 1A and 1B are graphs and illustrations in connection with non-uniform switching states. FIG. 1A includes a graph plotting magnetic characteristics of spins of the free layer within a domain against an applied magnetic field when the spins are arrayed in a vortex structure, as shown in the illustration below the graph in FIG. 1A. In this structure, the free layer is made of a ferromagnetic material and provided in the MRAM structure. FIG. 1B is a graph plotting magnetic characteristics of spins of the free layer within a domain when the spins are in a fixed state at some portion, as shown in the illustration below the graph in FIG. 1B. In such a structure, the MRAM exhibits non-uniform switching states.

To determine non-uniform switching states of an MRAM, a measurement device that systematically measures characteristics of the MRAM is necessary. A conventional method of measuring switching characteristics of the MRAM is accomplished by measuring resistance of a unit cell under a magnetic field in every unit cell. In this case, a significant amount of time is required to measure all properties of an MRAM array at a wafer level because it takes time for the magnetic field to be stabilized. Conventionally, a method of synchronizing a resistance measurement with the magnetic field has been introduced in an effort to increase measurement speed. However, this conventional method cannot measure remanence, and, thus, the cause of the non-uniform switching process in the MRAM cannot be identified.

SUMMARY OF THE INVENTION

The present invention is therefore directed to an apparatus and method of analyzing an MRAM, which substantially overcome one or more of the problems due to the limitations and disadvantages of the related art.

It is a feature of an embodiment of the present invention to provide an apparatus and method of analyzing an MRAM, which is capable of quickly measuring a switching characteristic of an MRAM array at a wafer level.

It is another feature of an embodiment of the present invention to provide an apparatus and method of analyzing an MRAM, which is capable of quickly measuring characteristics of an entire MRAM having an MRAM cell array consisting of a plurality of unit cells or an integrated structure of wafer-level unit cells with an apparatus having a relatively simple structure.

It is still another feature of an embodiment of the present invention to provide an apparatus and method of analyzing an MRAM, which is capable of analyzing characteristics and a defect rate of an MRAM at an early stage in the manufacturing process, thereby increasing yield of a high quality MRAM.

At least one of the above and other features and advantages of the present invention may be realized by providing an apparatus for analyzing a magnetic random access memory (MRAM) including an MRAM mounting unit on which an MRAM is mounted, a magnetic field applying unit positioned around the MRAM mounting unit for applying an external magnetic field to the MRAM mounted on the MRAM mounting unit, a cell addressing unit for selecting one of a plurality of unit cells of the MRAM mounted on the MRAM mounting unit, a source measurement unit for applying an internal magnetic field to the selected unit cell of the MRAM or for measuring a resistance of the selected unit cell of the MRAM, and a computer unit for storing and for analyzing data regarding the measured resistance of the each of the plurality of unit cells of the MRAM.

The magnetic field applying unit may include a power supply unit for supplying power and a magnetic field generator for generating the external magnetic field applied to the MRAM that is mounted on the MRAM mounting unit. The magnetic field generator may be a Helmholtz coil formed in a shape of a turned circular coil.

The cell addressing unit may include a matrix switch for selecting the one of the plurality of unit cells of the MRAM mounted on the MRAM mounting unit and a probe card mounted on a position corresponding to the MRAM, the probe card for supplying power to the selected unit cell or for reading data from the selected unit cell.

The apparatus may further include a magnetic field measurement unit for measuring the external magnetic field applied to the MRAM by the magnetic field applying unit.

At least one of the above and other features and advantages of the present invention may be realized by providing a method of analyzing a magnetic random access memory (MRAM) including (a) applying a magnetic field to an MRAM cell array, (b) selecting a target unit cell from among a plurality of unit cells in the MRAM cell array, (c) measuring a resistance of the selected target unit cell and storing the measured resistance, (d) varying a strength of the magnetic field applied to the selected target unit cell and measuring resistances of the selected target unit cell according to the varied strength of the magnetic field, and (e) executing (b) through (d) for each of the plurality of unit cells that constitute the MRAM cell array.

At least one of the above and other features and advantages of the present invention may be realized by providing a method of analyzing a magnetic random access memory (MRAM) including (a) applying a magnetic field to an MRAM cell array, (b) selecting a target unit cell from among a plurality of unit cells in the MRAM cell array, (c) measuring a resistance of the selected target unit cell and storing the measured resistance, (d) executing (b) and (c) for the remaining unit cells that constitute the MRAM cell array, and (e) varying a strength of the magnetic field and executing (a) through (d) for each of the plurality of unit cells in the MRAM cell array.

In either of these methods, applying the magnetic field may be performed by a Helmholtz coil formed in a shape of a turned circular coil. In either of these methods, selecting the target unit cell may include using previously input address information of the MRAM cell array by a cell addressing unit. In either of these methods, measuring the resistance of the selected target unit cell may include using data that is obtained by a probe of a probe card, the probe card being positioned at a data storage portion of the selected target unit cell.

At least one of the above and other features and advantages of the present invention may be realized by providing a method of analyzing a magnetic random access memory (MRAM) including (a) selecting a target unit cell from among a plurality of unit cells in an MRAM cell array, (b) applying a magnetic field to the selected target unit cell, (c) measuring a resistance of the selected target unit cell and storing the measured resistance, (d) varying a strength of the magnetic field applied to the selected target unit cell and measuring resistances of the selected target unit cell according to the varied strength of the magnetic field, and (e) executing (a) through (d) for each of the plurality of unit cells that constitute the MRAM cell array.

At least one of the above and other features and advantages of the present invention may be realized by providing a method of analyzing a magnetic random access memory (MRAM) including (a) selecting a target unit cell from among a plurality of unit cells in an MRAM cell array, (b) applying a magnetic field to the selected target unit cell, (c) measuring a resistance of the selected target unit cell and storing the measured resistance, (d) executing (a) through (c) for the remaining unit cells that constitute the MRAM cell array, and (e) varying a strength of the magnetic field and executing (a) through (d) for each of the plurality of unit cells in the MRAM cell array.

In either of these methods, selecting the target unit cell may include using previously input address information of the MRAM cell array by a cell addressing unit. In either of these methods, applying the magnetic field may include applying an electric potential to the selected target unit cell, thereby forming an internal magnetic field. In either of these methods, measuring the resistance of the selected target unit cell may include using data that is obtained by a probe of a probe card, the probe card being positioned at a data storage portion of the selected target unit cell.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2003-83614, filed on Nov. 24, 2003, in the Korean Intellectual Property Office and entitled: "Apparatus and Method of Analyzing Magnetic Random Access Memory," is incorporated by reference herein in its entirety.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote like elements throughout.

Figure 2A:
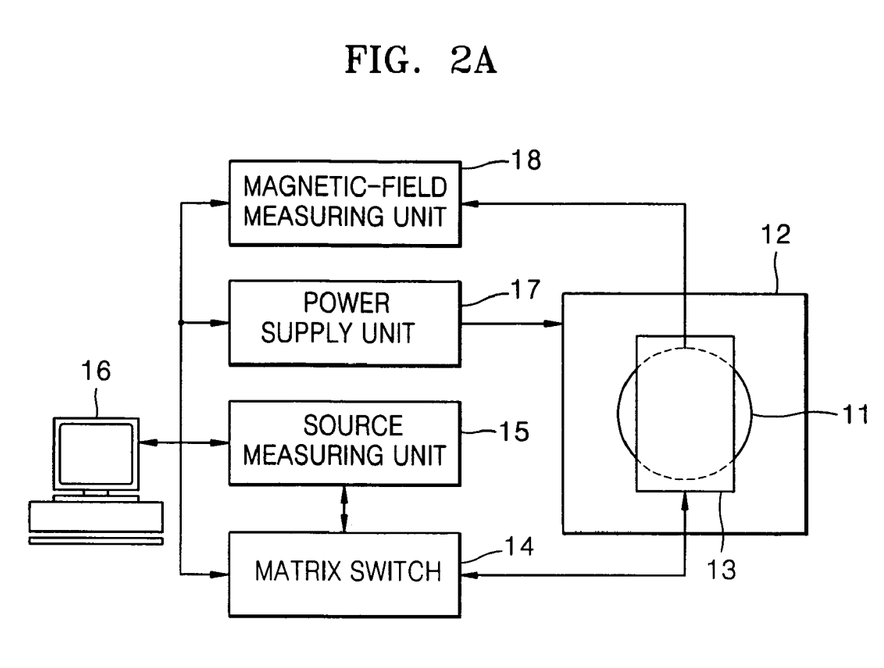
FIG. 2A illustrates an apparatus for analyzing an MRAM according to an embodiment of the present invention.

FIG. 2A illustrates an apparatus for analyzing an MRAM according to an embodiment of the present invention. The analysis apparatus includes an MRAM mounting unit 11 on which an MRAM is mounted, a magnetic field applying unit including a magnetic field generator 12 and a power supply 17 that applies a magnetic field around the MRAM mounting unit 11, a cell addressing unit including a probe card 13 and a matrix switch 14 that selects a specific cell of the target MRAM to be analyzed and obtains necessary data, a source measurement unit 15 that measures a resistance of the selected cell of the MRAM, and a computer unit 16 that collects, analyzes and stores information on the resistance of each selected cell of the MRAM. The analysis apparatus may further include a magnetic field measurement unit 18 that gauges a strength of a magnetic field applied to the MRAM during an analysis procedure.

Figure 2B:
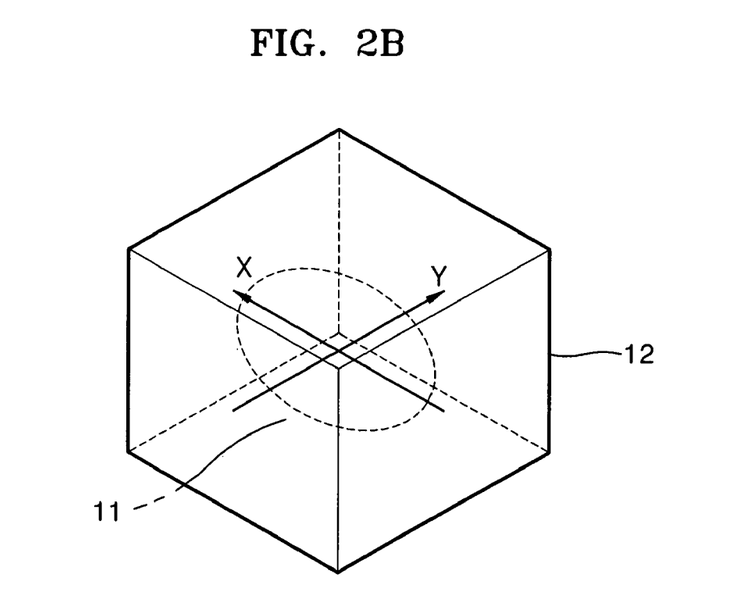
FIG. 2B illustrates an MRAM mounting unit disposed within a magnetic field generator of the magnetic field applying unit shown in FIG. 2A.

FIG. 2B illustrates the MRAM mounting unit 11, which is disposed within the magnetic field generator 12, of the magnetic field applying unit.

Referring to FIG. 2B, the magnetic field generator 12 surrounds the MRAM mounting unit 11 in order to apply a uniform magnetic field to the MRAM, which is mounted on the MRAM mounting unit 11. The MRAM that is mounted on the MRAM mounting unit 11 has an ordinary array structure. That is, the MRAM has an integrated structure of wafer-level unit cells, in which a plurality of unit cells (for example, m×n unit cells) are arrayed in a matrix form.

As described above, the magnetic field applying unit 12 includes the power supply unit 17 and the magnetic field generator 12. The power supply unit 17 supplies power for generating the magnetic field and the magnetic field generator 12 generates the magnetic field using the supplied power. The magnetic field generator 12 is designed to apply a uniform magnetic field to the MRAM mounted on the MRAM mounting unit 11 in both x- and y-directions. The magnetic field generator 12 may use a Helmholtz coil formed in a shape of turned circular coil.

Figure 2C:
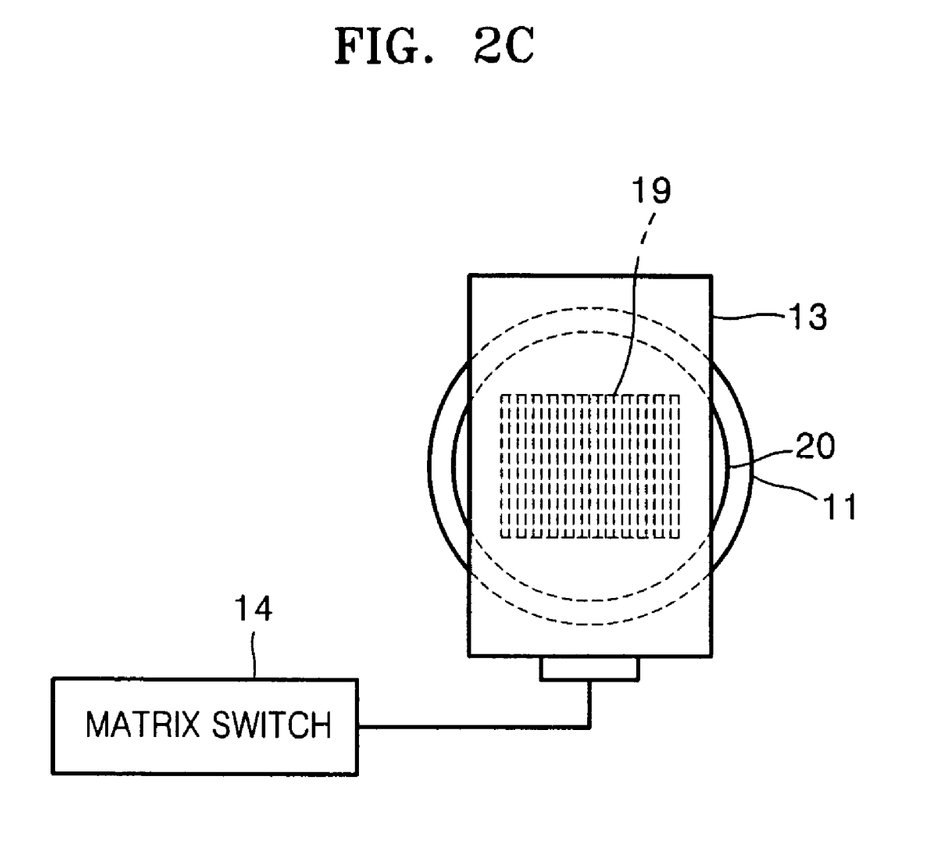
FIG. 2C illustrates a cell addressing unit for analyzing a target MRAM in the apparatus for analyzing the MRAM according to the present invention.

FIG. 2C illustrates the cell addressing unit 13 that is loaded on a wafer-level MRAM cell array 20 in the apparatus for analyzing an MRAM according to an embodiment of the present invention. As described above, the cell addressing unit includes the probe card 13 and the matrix switch 14. The matrix switch 14 selects a specific unit cell 19 to be analyzed in the MRAM cell array 20. The probe card 13 may be an ordinary probe card that inspects semiconductor devices. Probes of the probe card 13 are in contact with each unit cell 19 which constitutes the MRAM cell array 20. The specific unit cell 19 of the MRAM cell array 20 is designated and selected by the matrix switch 14.

The source measurement unit 15 will now be described with reference to FIGS. 2A and 2C. The source measurement unit 15 applies an internal magnetic field to the MRAM cell array 20 mounted on the MRAM mounting unit 11. Further, the source measurement unit 15 functions to acquire data, e.g. resistance, of the specific unit cell 19. The source measurement unit 15 may be a conventional measurement unit that is widely used in the related art. The source measurement unit 15 applies an electric potential to the specific unit cell 19 that is selected by the matrix switch 14, such that the internal magnetic field is formed only at the specific unit cell 19. Further, the source measurement unit 15 can measure the resistance of the specific unit cell 19 using an electric signal on the probe card 13. Since the function of the above-described source measurement unit 15 is well known in the art of general device analysis, a detailed description will be omitted.

The computer unit 16 stores data, such as the resistances of the MRAM, which are acquired by the source measurement unit 15. The computer unit 16 also analyzes characteristics of the MRAM. Furthermore, the computer unit 16 transmits an address of the target unit cell to the matrix switch 14. Thus, the computer unit 16 provides data so that the matrix switch 14 can select the specific unit cell 19 using data that is previously given in a process of designing the MRAM cell array.

The analysis apparatus according to the present invention may further include the magnetic field measurement unit 18 that gauges a strength of a magnetic field strength applied to the MRAM cell array 20, in which the MRAM cell array 20 is mounted on the MRAM mounting unit 11, within the magnetic field generator 12.

Figure 3A:
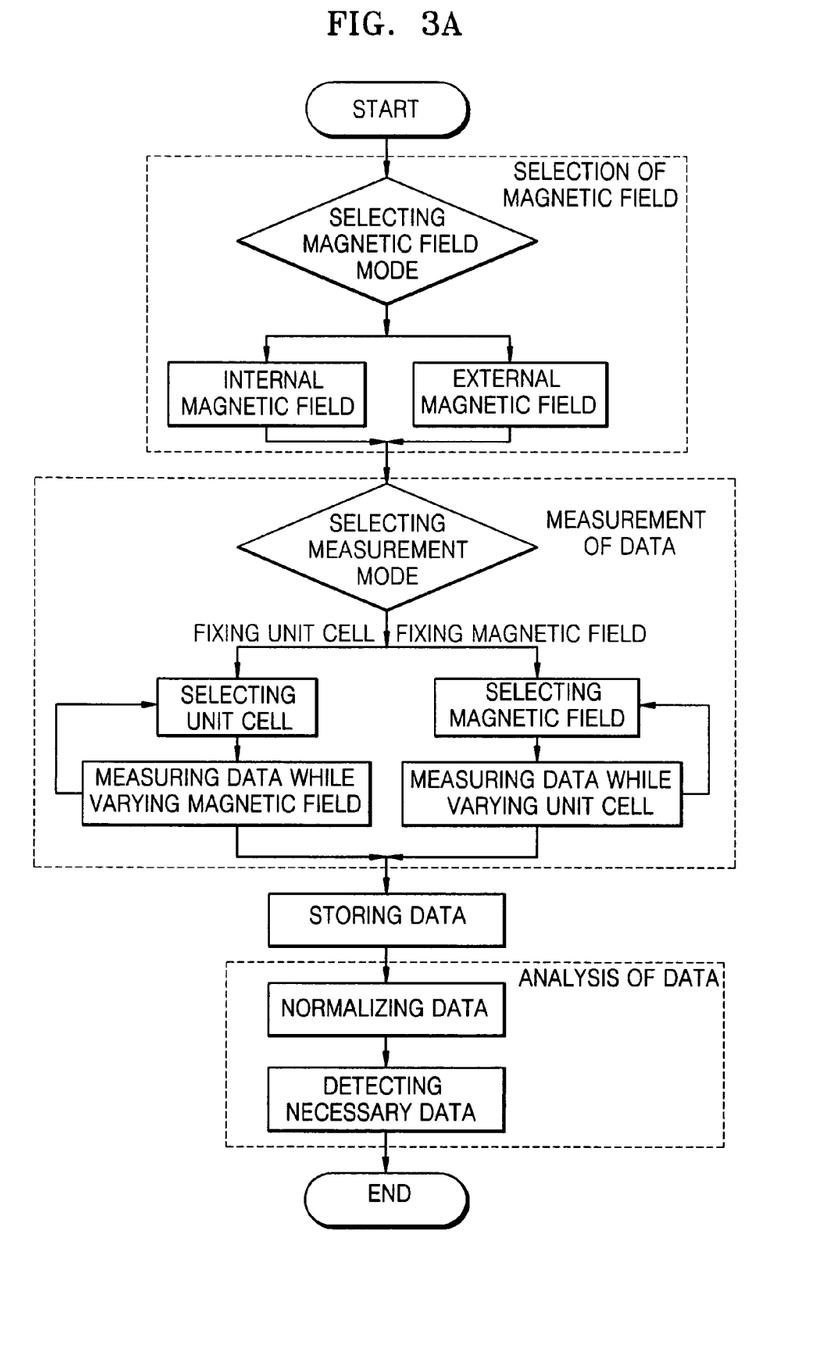
FIG. 3A is a flowchart of a method of analyzing an MRAM according to an embodiment of the present invention.
Figure 3B:
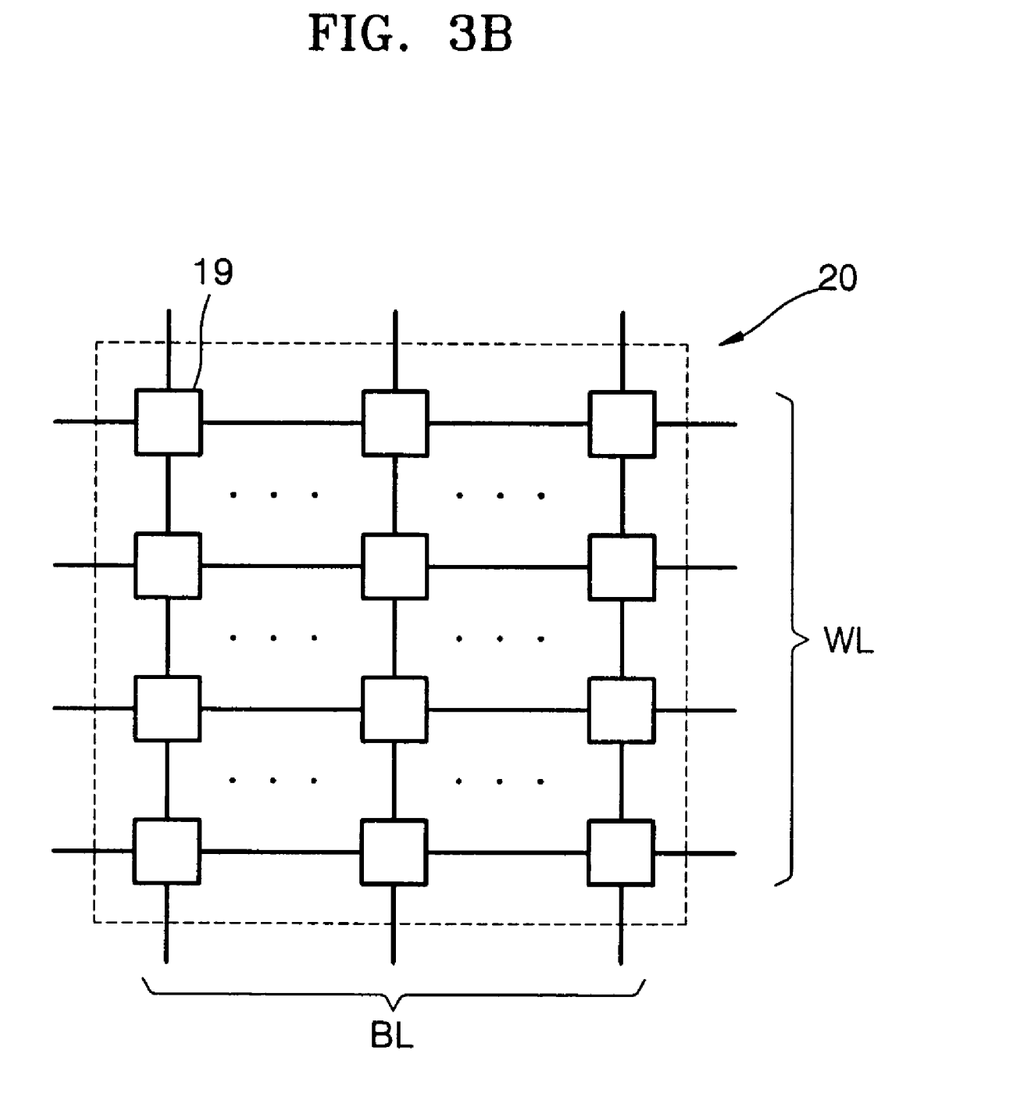
FIG. 3B illustrates an MRAM cell array.

An analysis method of MRAM according to the present invention will now be described in detail. FIG. 3A is a flowchart of a method of analyzing an MRAM according to an embodiment of the present invention. FIG. 3B illustrates the MRAM cell array 20.

The analysis method according to an embodiment of the present invention analyzes resistances of unit cells of an MRAM when a uniform magnetic field is applied to the MRAM cell array 20 or a specific unit cell of the MRAM.

The analysis method according to an embodiment of the present invention includes selecting a magnetic field mode, measuring data according to a selection of a measurement mode, and analyzing data. Operation of the analysis method will now be described.

In the selection of the magnetic field mode, it is determined whether to apply an external magnetic field or an internal magnetic field to the MRAM cell array 20 or the specific unit cell 19 of the MRAM. If an external magnetic field is applied, the magnetic field generator 12 applies a uniform magnetic field to the entire MRAM cell array 20. If an internal magnetic field is applied, the source measurement unit 15 applies an electric potential to the specific unit cell 19 through the probe card 13 such that a magnetic field is formed only at the specific unit cell 19 of the MRAM.

When characteristics of the MRAM cell array 20 are analyzed under the external magnetic field, there is an advantage of a fast analysis time. When characteristics of the MRAM cell array 20 are analyzed at every unit cell under the internal magnetic field, there is a disadvantage in that a significant amount of time is required to analyze the characteristics of the entire MRAM cell array 20, but there is an advantage in that the analysis is performed under circumstances similar to an actual operation of the MRAM cell array 20. The present invention provides an analysis method of an MRAM, which is adaptable to both cases. Further, the analysis method of the present invention can be used to analyze the unit cell of an MRAM, the MRAM cell array, and the wafer-level MRAM.

In operation, the target MRAM that is intended to be analyzed is mounted on the MRAM mounting unit 11. It is possible to inspect a process-finished MRAM as well as a wafer that has an MRAM integrated during a fabricating process.

After mounting the MRAM, a specific unit cell 19 of the entire unit cell array is designated. Herein, a location of the specific unit cell 19 that is designated by the matrix switch 14 is searched using address information of the MRAM stored in the computer unit 16. The probe card 13 is in contact with a location corresponding to the address of the specific unit cell 19.

The uniform magnetic field is then applied to the mounted MRAM. In the context of an embodiment of the present invention, when the external magnetic field is applied, the power supply unit 17 applies electric potentials $I_1$ and $I_2$ to the magnetic field generator 12 and magnetic fields $H_x$ and $H_y$ are formed at the magnetic field generator 12. As shown in FIG. 2B, the uniform magnetic field is applied to the entire MRAM. The magnetic field that is applied to the MRAM can be measured accurately by the magnetic field measurement unit 18. When the internal magnetic field is applied by the source measurement unit 15, the cell addressing unit including the probe card 13 and the matrix switch 14 designates the specific unit cell 19, and the source measurement unit 15 applies electric potentials $I_1$ and $I_2$. As shown in FIG. 3B, the electric potentials are applied only to the specific unit cell 19 through a word line WL and a bit line BL, thereby generating the internal magnetic field only at the specific unit cell 19. The magnetic field mode can use both the directly applied magnetic field and a residual magnetic field, which remains after the magnetic field is applied for a certain time.

The measuring of data according to a selection of a measurement mode will now be described in detail. Desired data, e.g., the resistance of the MRAM, are measured in a state in which the external or internal magnetic field is applied. That is, the data is read from the specific unit cell 19, which is designated by the cell addressing unit including the probe card 13 and the matrix switch 14 of the analysis apparatus according to the present invention.

One of two modes may be selected. In a first mode, i.e., a fixing cell mode, the resistance of the specific unit cell 19 of the MRAM cell array 20 is measured in a state in which the magnetic field is applied to the specific unit cell 19 of the MRAM cell array 20, and then, the resistance of each unit cell 19 of the entire MRAM cell array 20 is measured under the same magnetic field strength. The resistance of each unit cell 19 is then measured while the strength of the magnetic field is varied. In short, the resistance of each unit cell 19 is measured under a fixed strength of the magnetic field, and then, the characteristics of the MRAM are analyzed under the varying strength of a magnetic field.

In a second mode, i.e., a fixing magnetic field mode, the specific unit cell 19 of the MRAM is selected. A predetermined strength of the magnetic field is applied to the selected unit cell 19 and the resistance of the selected unit cell 19 is measured. Then, a resistance of the selected unit cell 19 is measured in a state in which the magnetic field strength is varied. More specifically, the resistances of the unit cell 19 are measured while varying the strength of the magnetic field that is applied in a state in which the unit cell is fixed. After measuring all resistances of a single specific unit cell 19 corresponding to a full measurement range of the magnetic field strength, resistances of another unit cell corresponding to the measurement ranges of the magnetic field strength are measured. In this manner, the remaining unit cells are measured.

In the selection of the specific unit cell 19, the matrix switch 14 of the cell addressing unit including the probe card 13 and the matrix switch 14 designates a measuring order of the unit cells of the MRAM cell array 20 using the address information of the MRAM cell array 20, which has been previously stored in the computer unit 16. The probe of the probe card 13 continuously detects data of the unit cells 19 of the MRAM cell array 20 in the designated order. The source measurement unit 15 reads the resistances of the unit cells 19 and the computer unit 16 stores the read resistances.

The source measurement unit 15 reads the resistance using a current that flows through the probe of the probe card 13, which is in contact with each unit cell 19, for example, a current that is extracted from a data storage area of a magnetic tunnel junction (MTJ) structure. The resistances are then stored in the computer unit 16. The measuring of data according to the selection of the measurement mode can be applied to either the external magnetic field or the internal magnetic field.

A case of applying a predetermined external magnetic field to the MRAM cell array 20 will now be described. The matrix switch 14 selects the specific unit cell 19 and the source measurement unit 15 applies a source voltage to the selected unit cell 19 through the probe card 13. The source measurement unit 15 reads the resistance using the current that is extracted from the selected specific unit cell 19, and the read resistance is stored in the computer unit 16.

A method of measuring data while varying magnetic field strength (in a state in which the unit cell is fixed) will now be described. The power supply unit 17 varies power so that the magnetic field generator 12 generates different magnetic fields. Through repetition of the above process, resistances of the selected unit cell 19 are measured over a certain range of magnetic field strength. Such processes are repeated for each unit cell of the MRAM cell array 20.

A method of measuring data while selectively varying the unit cells (in a state in which the magnetic field is fixed) will now be described. Initially, resistance of the selected unit cell 19 is measured under a predetermined external magnetic field strength. Subsequently, resistances of the unit cells are measured while varying the unit cells under the same strength of the external magnetic field. Resistances of the unit cells are then measured while varying the external magnetic field strength. All the measured resistances of the unit cells 19 are stored.

As described above, the resistances of the unit cells 19 of the MRAM cell array 20 are measured and stored in the computer unit 16. Various analysis data about each of the unit cells 19 of the MRAM cell array 20 can be obtained by combining the data regarding the measured characteristic resistances. Analysis of the data may include normalizing the data and detecting necessary data. For example, it is possible to obtain a hysteresis loop, which represents a variation of resistance with respect to the applied magnetic field. In addition, a hysteresis loop for the entire MRAM may also be obtained through its combinations. A switching field can be found by differentiating the hysteresis loop and an asteroid curve can be plotted. The computer unit 16 analyzes the given data to obtain the analysis data. Since theories, such as equations used for such analysis, are well known, a detailed description thereof will be omitted.

Figure 4A:
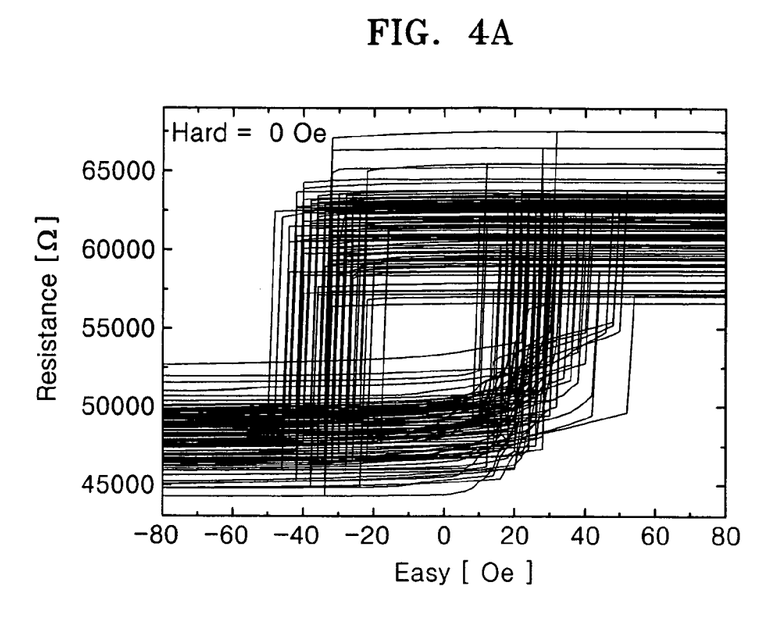
FIGS. 4A and 4B are hysteresis graphs illustrating magnetic characteristics of an MRAM with respect to electric potential when an external magnetic field is applied by a magnetic field applying unit.
Figure 4B:
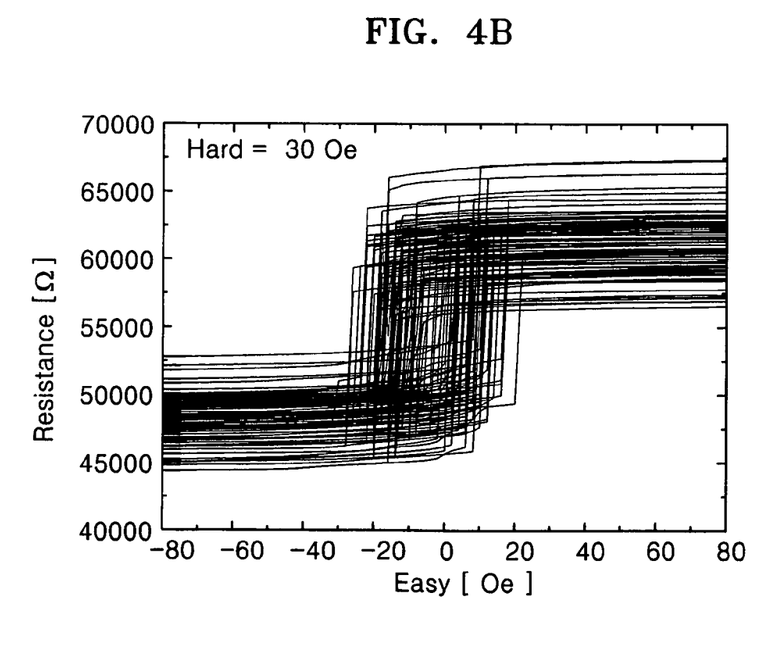
Figure 4C:
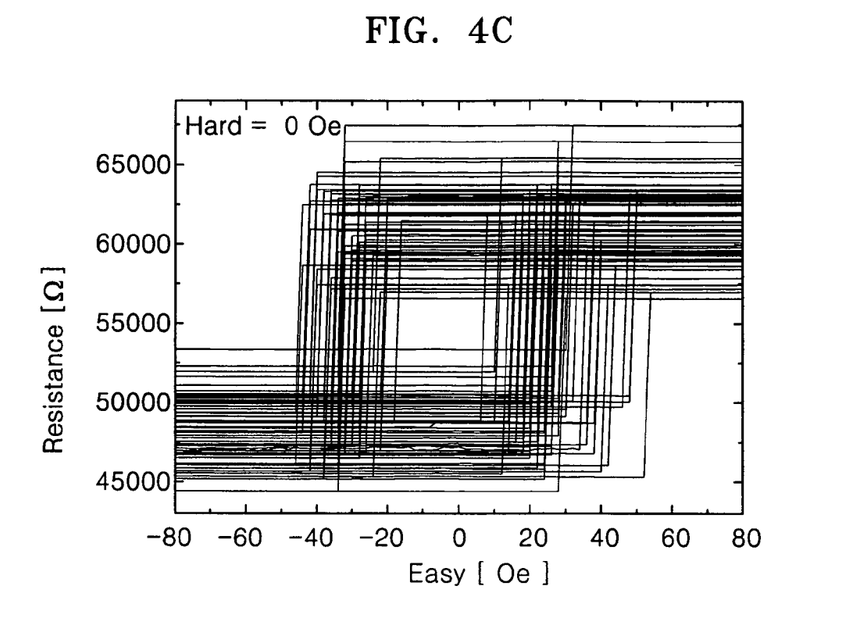
FIGS. 4C and 4D are hysteresis graphs illustrating residual induction of an MRAM with respect to electric potential when an external magnetic field is applied by a magnetic field applying unit.
Figure 4D:
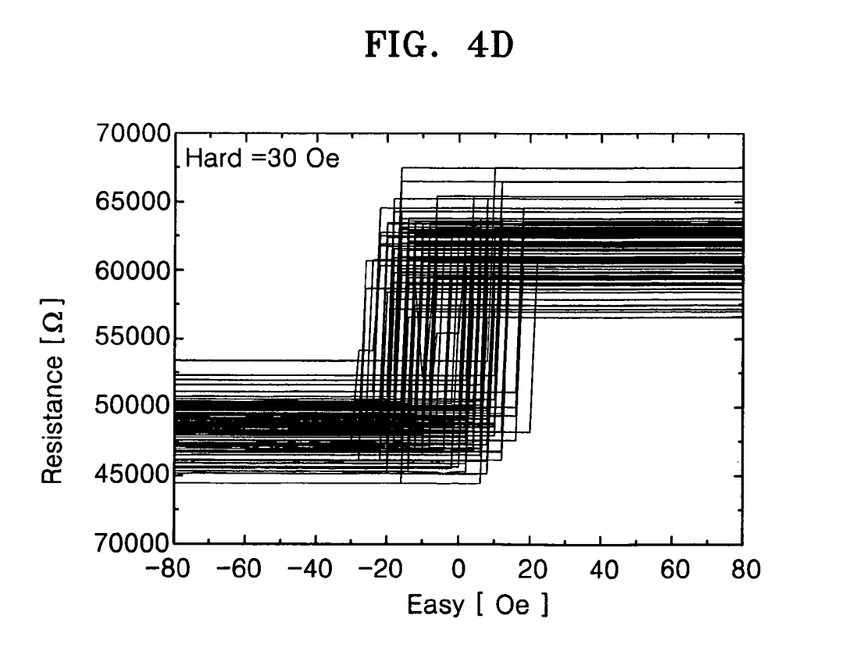

FIGS. 4A and 4B are hysteresis graphs illustrating magnetic characteristics of the MRAM cell array 20 with respect to the strength of the external magnetic field applied by the magnetic field generator 12 according to an embodiment of the present invention. FIGS. 4C and 4D are hysteresis graphs illustrating residual induction of the MRAM with respect to the external magnetic field applied by the magnetic field generator 12 according to an embodiment of the present invention. In the drawings, all hysteresis loops of each of the unit cells 19 of the MRAM cell array 20 are shown in a single graph.

Figure 5A:
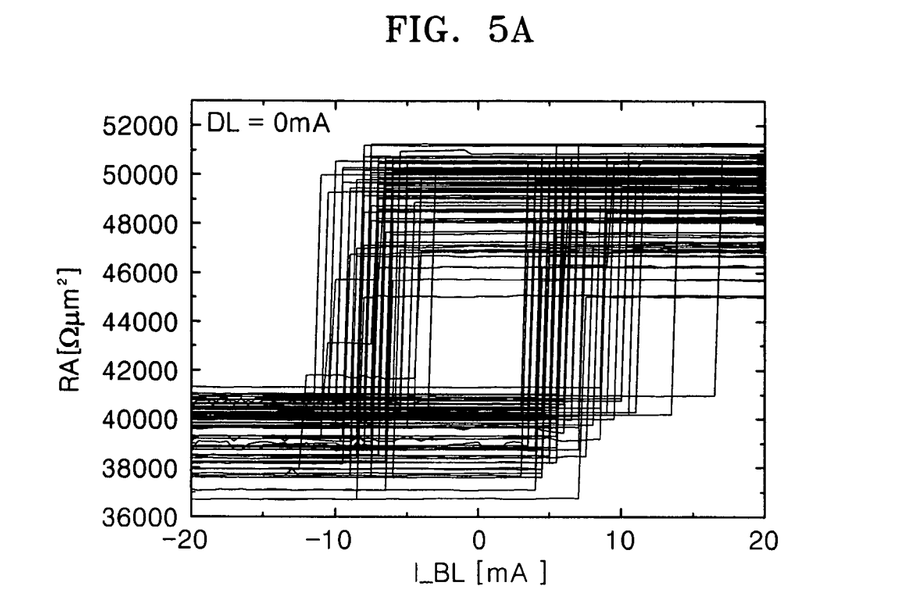
FIGS. 5A and 5B are hysteresis graphs illustrating magnetic characteristics of an MRAM with respect to electric potential when an internal magnetic field is applied by a source measurement unit.
Figure 5B:
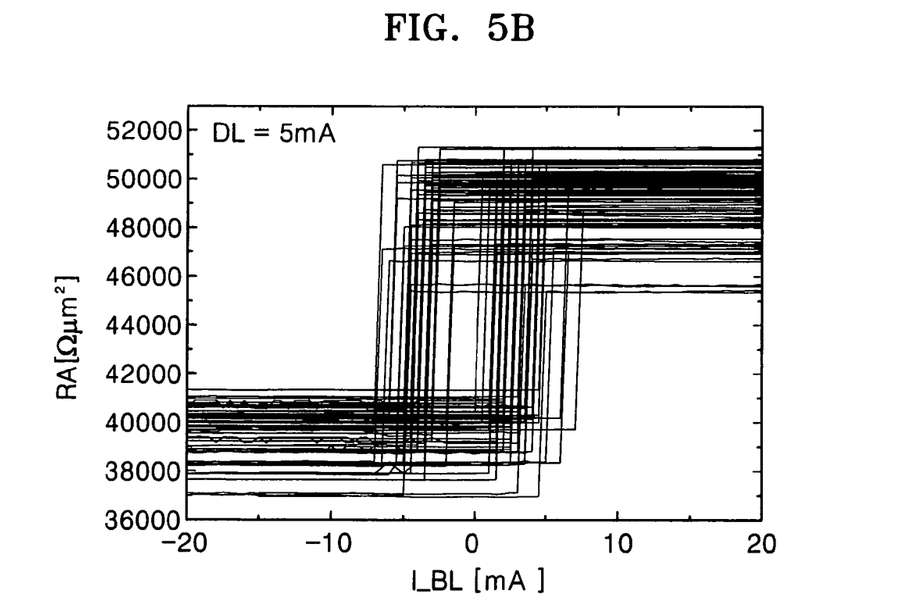

FIGS. 5A and 5B are hysteresis graphs illustrating magnetic characteristics of the MRAM with respect to the internal magnetic field that is applied by the source measurement unit 15 according to an embodiment of the present invention.

Figure 6A:
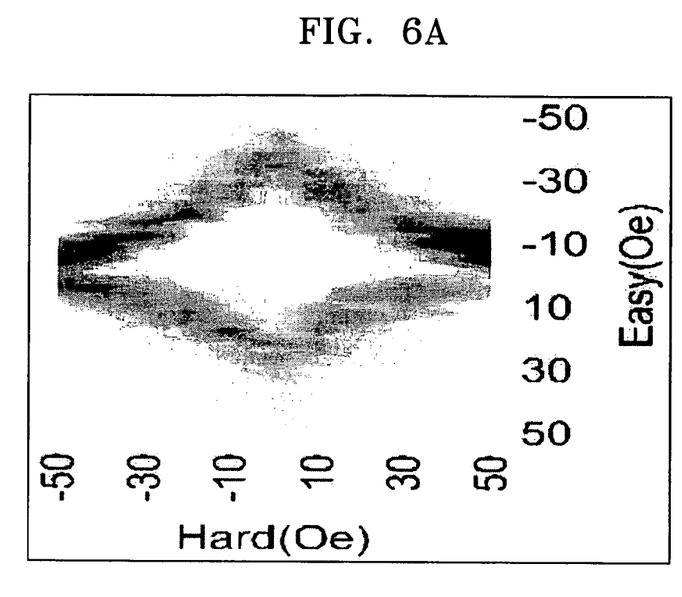
FIGS. 6A and 6B are asteroid curves that are plotted by combining measured hysteresis graphs after application of external and internal magnetic fields to a MRAM cell array in the method of analyzing an MRAM according to an embodiment of the present invention.
Figure 6B:
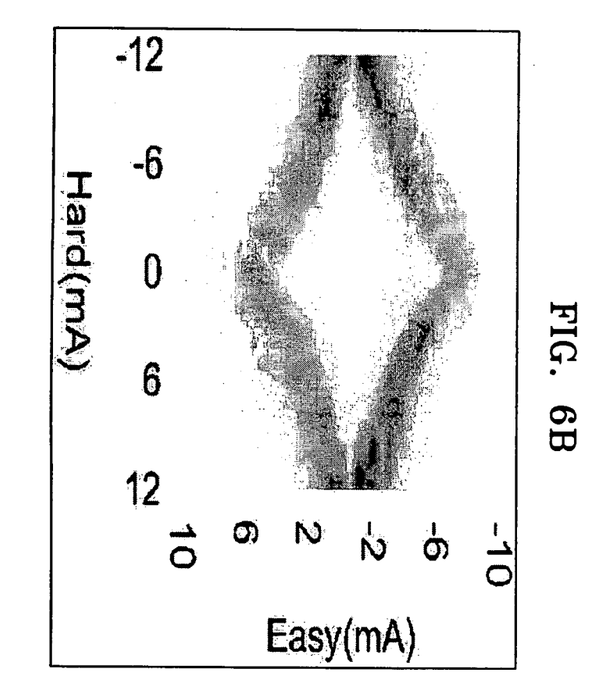

FIGS. 6A and 6B are asteroid curves that are plotted out of hysteresis loops, which are measured after applying the external and internal magnetic fields to the MRAM cell array 20, according to a method of analyzing an MRAM according to an embodiment of the present invention. By selecting values that are located outside the lozenge-shaped asteroid curve, the switching fields of the whole MRAM cell array 20 are easily extracted to drive the MRAM cell array 20.

According to the present invention, characteristics of the entire MRAM having the MRAM cell array consisting of a plurality of unit cells or an integrated structure of wafer-level unit cells can be quickly measured with an apparatus having a relatively simple structure.

Further, the present invention is able to analyze characteristics and a defect rate of an MRAM at an early stage in the manufacturing process, thereby increasing yield of a high quality MRAM.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for analyzing a magnetic random access memory (MRAM), comprising:
    an MRAM mounting unit on which an MRAM is mounted;
    a magnetic field applying unit positioned around the MRAM mounting unit for applying an external magnetic field to the MRAM mounted on the MRAM mounting unit;
    a cell addressing unit for selecting one of a plurality of unit cells of the MRAM mounted on the MRAM mounting unit;
    a source measurement unit for applying an internal magnetic field to the selected unit cell of the MRAM or for measuring a resistance of the selected unit cell of the MRAM; and
    a computer unit for storing and for analyzing data regarding the measured resistance of the each of plurality of unit cells of the MRAM.

2. The apparatus as claimed in claim 1, wherein the magnetic field applying unit comprises:
    a power supply unit for supplying power; and
    a magnetic field generator for generating the external magnetic field applied to the MRAM that is mounted on the MRAM mounting unit.

3. The apparatus as claimed in claim 2, wherein the magnetic field generator is a Helmholtz coil formed in a shape of a turned circular coil.

4. The apparatus as claimed in claim 1, wherein the cell addressing unit comprises:
    a matrix switch for selecting the one of the plurality of unit cells of the MRAM mounted on the MRAM mounting unit; and
    a probe card mounted on a position corresponding to the MRAM, the probe card for supplying power to the selected unit cell or for reading data from the selected unit cell.

5. The apparatus as claimed in claim 1, further comprising a magnetic field measurement unit for measuring the external magnetic field applied to the MRAM by the magnetic field applying unit.

6. A method of analyzing a magnetic random access memory (MRAM), comprising:
    (a) applying a magnetic field to an MRAM cell array;
    (b) selecting a target unit cell from among a plurality of unit cells in the MRAM cell array;
    (c) measuring a resistance of the selected target unit cell and storing the measured resistance;
    (d) varying a strength of the magnetic field applied to the selected target unit cell and measuring resistances of the selected target unit cell according to the varied strength of the magnetic field; and
    (e) executing (b) through (d) for each of the plurality of unit cells that constitute the MRAM cell array.

7. The method as claimed in claim 6, wherein applying the magnetic field is performed by a Helmholtz coil formed in a shape of a turned circular coil.

8. The method as claimed in claim 6, wherein selecting the target unit cell comprises using previously input address information of the MRAM cell array by a cell addressing unit.

9. The method as claimed in claim 6, wherein measuring the resistance of the selected target unit cell comprises using data that is obtained by a probe of a probe card, the probe card being positioned at a data storage portion of the selected target unit cell.

10. A method of analyzing a magnetic random access memory (MRAM), comprising:
    (a) applying a magnetic field to an MRAM cell array;
    (b) selecting a target unit cell from among a plurality of unit cells in the MRAM cell array;
    (c) measuring a resistance of the selected target unit cell and storing the measured resistance;
    (d) executing (b) and (c) for the remaining unit cells that constitute the MRAM cell array; and
    (e) varying a strength of the magnetic field and executing (a) through
    (d) for each of the plurality of unit cells in the MRAM cell array.

11. The method as claimed in claim 10, wherein applying the magnetic field is performed by a Helmholtz coil formed in a shape of a turned circular coil.

12. The method as claimed in claim 10, wherein selecting the target unit cell comprises using previously input address information of the MRAM cell array by a cell addressing unit.

13. The method as claimed in claim 10, wherein measuring the resistance of the selected target unit cell comprises using data that is obtained by a probe of a probe card, the probe card being positioned at a data storage portion of the selected target unit cell.

14. A method of analyzing a magnetic random access memory (MRAM), comprising:
    (a) selecting a target unit cell from among a plurality of unit cells in an MRAM cell array;
    (b) applying a magnetic field to the selected target unit cell;
    (c) measuring a resistance of the selected target unit cell and storing the measured resistance;
    (d) varying a strength of the magnetic field applied to the selected target unit cell and measuring resistances of the selected target unit cell according to the varied strength of the magnetic field; and
    (e) executing (a) through (d) for each of the plurality of unit cells that constitute the MRAM cell array.

15. The method as claimed in claim 14, wherein selecting the target unit cell comprises using previously input address information of the MRAM cell array by a cell addressing unit.

16. The method as claimed in claim 14, wherein applying the magnetic field comprises applying an electric potential to the selected target unit cell, thereby forming an internal magnetic field.

17. The method as claimed in claim 14, wherein measuring the resistance of the selected target unit cell comprises using data that is obtained by a probe of a probe card, the probe card being positioned at a data storage portion of the selected target unit cell.

18. A method of analyzing a magnetic random access memory (MRAM), comprising:
  (a) selecting a target unit cell from among a plurality of unit cells in an MRAM cell array;
  (b) applying a magnetic field to the selected target unit cell;
  (c) measuring a resistance of the selected target unit cell and storing the measured resistance;
  (d) executing (a) through (c) for the remaining unit cells that constitute the MRAM cell array; and
  (e) varying a strength of the magnetic field and executing (a) through (d) for each of the plurality of unit cells in the MRAM cell array.

19. The method as claimed in claim 18, wherein selecting the target unit cell comprises using previously input address information of the MRAM cell array by a cell addressing unit.

20. The method as claimed in claim 19, wherein applying the magnetic field comprises applying an electric potential to the selected target unit cell, thereby forming an internal magnetic field.

21. The method as claimed in claim 19, wherein measuring the resistance of the selected target unit cell comprises using data that is obtained by a probe of a probe card, the probe card being positioned at a data storage portion of the selected target unit cell.

* * * * *